United States Patent
Ma et al.

(10) Patent No.: US 8,466,043 B2
(45) Date of Patent: Jun. 18, 2013

(54) PROCESS OF INTERNAL GETTERING FOR CZOCHRALSKI SILICON WAFER

(75) Inventors: Xiangyang Ma, Hangzhou (CN); Ze Xu, Hangzhou (CN); Biao Wang, Hangzhou (CN); Deren Yang, Hangzhou (CN)

(73) Assignee: Zhejiang University, Hangzhou, Zhejiang Province (CN)

( * ) Notice: Subject to any disclaimer, the term of this patent is extended or adjusted under 35 U.S.C. 154(b) by 0 days.

(21) Appl. No.: 13/695,517

(22) PCT Filed: Mar. 16, 2012

(86) PCT No.: PCT/CN2012/072453
§ 371 (c)(1),
(2), (4) Date: Oct. 31, 2012

(87) PCT Pub. No.: WO2012/126334
PCT Pub. Date: Sep. 27, 2012

(65) Prior Publication Data
US 2013/0045586 A1  Feb. 21, 2013

(30) Foreign Application Priority Data
Mar. 23, 2011 (CN) .......................... 2011 1 0070161

(51) Int. Cl.
*H01L 21/324* (2006.01)
(52) U.S. Cl.
USPC ................. 438/471; 257/913; 257/E21.321
(58) Field of Classification Search
USPC ......... 438/58, 143, 310, 402, 471, FOR. 144; 257/913, E21.321
See application file for complete search history.

(56) References Cited

U.S. PATENT DOCUMENTS

| | | | | |
|---|---|---|---|---|
| 4,868,133 A | * | 9/1989 | Huber | 438/471 |
| 5,401,669 A | * | 3/1995 | Falster et al. | 438/476 |
| 6,436,846 B1 | * | 8/2002 | Tews et al. | 438/770 |
| 7,977,216 B2 | * | 7/2011 | Park | 438/477 |
| 2002/0179003 A1 | * | 12/2002 | Iida et al. | 117/19 |
| 2005/0130394 A1 | * | 6/2005 | Falster | 438/480 |
| 2008/0044669 A1 | * | 2/2008 | Adachi | 428/446 |
| 2013/0045586 A1 | * | 2/2013 | Ma et al. | 438/471 |

FOREIGN PATENT DOCUMENTS

| | | |
|---|---|---|
| CN | 1251206 A | 4/2000 |
| CN | 1625802 A | 6/2005 |
| CN | 1769549 A | 5/2006 |
| CN | 1838388 A | 9/2006 |
| CN | 102168314 A | 8/2011 |

* cited by examiner

*Primary Examiner* — George Fourson, III
(74) *Attorney, Agent, or Firm* — Han IP Law PLLC

(57) ABSTRACT

An internal gettering process for a Czochralski silicon wafers comprises: (1) heating a Cz silicon wafer to 1200-1250° C. at a heating rate of 50-100° C./s under a nitrogen atmosphere, maintaining for 30-150 seconds, cooling the Cz silicon wafer to 800-1000° C. first at a cooling rate of 5-50° C./s, and then cooling the Cz silicon wafer naturally; (2) annealing the Cz silicon wafer obtained in the step (1) at 800-900° C. under an argon atmosphere for a period of 8-16 hours. The present invention only involves two heat treatment steps which require lower temperature and shorter time comparing to the conventional processes. The density of the bulk microdefects and the width of the denuded zone can be easily controlled by the temperature, duration and cooling rate of rapid thermal processing in the first step.

3 Claims, 3 Drawing Sheets

PROCESS OF INTERNAL GETTERING FOR CZOCHRALSKI SILICON WAFER

CROSS-REFERENCE TO RELATED APPLICATION

This application is the national phase application of International application number PCT/CN2012/072453, filed on Mar. 16, 2012, which claims the priority benefit of Chinese Patent Application No. 201110070161.4, filed on Mar. 23, 2011, which is hereby incorporated by reference in its entirety.

FIELD OF THE INVENTION

The present invention relates to an internal gettering process for Czochralski silicon wafers, and more particularly relates to a low thermal budget internal gettering process.

BACKGROUND

Czochralski (Cz) silicon wafers are the material most commonly used for integrated circuits (ICs) due to their internal gettering (IG) ability associated with oxygen precipitates. Metal contamination is inevitable during the fabrication of ICs. However, if metal contaminants cannot be removed from the active regions of the device, the fabrication yield of ICs will be significantly reduced. To solve this problem, normally a high density of oxygen precipitates and oxygen precipitation induced defects will be formed in the bulk of the silicon wafer (referred to as bulk microdefect (BMD) zone), while an oxygen-precipitate-free region (referred to as denuded zone, DZ) will be created in the near-surface region of the silicon wafer where the device active area resides. The oxygen precipitates and oxygen precipitation induced defects in the bulk of the silicon wafer will act as the gettering sites for the metal contaminants in the device active area. This is commonly referred to as IG. Generally, the heat treatment process that leads to the formation of the DZ and the BMD zone in the Cz silicon wafers is called IG process.

Currently, there are two mainstreams of IG processes for Cz silicon wafers. The first one is the high-low-high temperature (H-L-H) three-step annealing process. First, a Cz silicon wafer is annealed at 1100-1200° C. for several hours so as to let oxygen out-diffuse from the near-surface region of the silicon wafer, thereby reducing the oxygen concentration and in turn preventing the oxygen precipitation in the near-surface region. The purpose of this high temperature annealing is to form a DZ. The Cz silicon wafer is then annealed at 600-800° C. for several hours to enable the nucleation of oxygen precipitates in the bulk of the silicon wafer. During this low temperature annealing, the nucleation of oxygen precipitates in the near-surface region of the silicon wafer becomes very difficult due to the low oxygen concentration in this region. Finally, the Cz silicon wafer is annealed at 1000-1100° C. for a relatively long time (e. g., 16 h) to allow the growth of oxygen precipitate nuclei to form oxygen precipitates and oxygen precipitation induced defects in the bulk of the silicon wafer. No oxygen precipitates will be formed in the near-surface region of the silicon wafer at this step. During this high temperature annealing, secondary defects such as punched-out dislocations are generally induced. It is well-known that the IG process based on H-L-H three-step annealing is very time-consuming and has a high thermal budget.

The second type is the "Magic Denuded Zone™ (MDZ™)" process, which features the use of a rapid thermal processing (RTP) at high temperature developed by an American company, MEMC. In a typical process, a silicon wafer is first subjected to the RTP at 1250° C. for 60 seconds under an argon atmosphere, and then cooled at a certain rate. At this step, a high concentration of vacancies is generated in the bulk of the silicon wafer. Due to the out-diffusion of the vacancies, the vacancy concentration is gradually decreased from the bulk to the surface of the silicon wafer with a relatively low vacancy concentration at the surface. This vacancy concentration profile has a full control over the oxygen precipitation behavior of the wafer. That is, above a critical concentration, the vacancies sharply enhance the nucleation of oxygen precipitates. The silicon wafer is then annealed at 800° C. for 4 hours. At this annealing step, the relatively high vacancy concentration in the bulk of the silicon wafer can facilitate the formation of the oxygen precipitate nuclei, while no oxygen precipitate nuclei will be formed in the near-surface region of the silicon wafer due to the relatively low vacancy concentration in this region. Finally, the silicon wafer is annealed at 1000° C. for 16 h to form oxygen precipitates and oxygen precipitation induced defects in the bulk but not in the near-surface region of the silicon wafer. The advantage of "MDZ™" process is that the width of the DZ and the density of oxygen precipitates can be simply controlled by the cooling rate of the RTP. Moreover, this IG process, unlike the traditional H-L-H process, is nearly independent on the oxygen concentration and thermal history of the silicon wafer.

Comparing to the conventional H-L-H three-step annealing process, the MDZ™ process developed by MEMC can significantly reduce the thermal budget. However, since with ever-smaller feature size of ICs, the thermal budget in the device fabrication needs to be continuously decreased, the IG process for Cz silicon wafers has to be improved to further lower the annealing temperature and shorten the annealing time. Since 200 mm and 300 mm silicon wafers are commonly used in the large scale IC fabrication, a low thermal budget IG process is more important for these silicon wafers.

SUMMARY

The present invention provides a low thermal budget IG process that can form a DZ in the near-surface region and a BMD zone in the bulk of a Cz silicon wafer. This low thermal budget IG process is specifically suitable for 200 and 300 mm silicon wafers.

An IG process for a Cz silicon wafer may comprise:

(1) Heating a Cz silicon wafer to a temperature in a range of 1200-1250° C. at a heating rate of 50-100° C./s under a nitrogen atmosphere, maintaining for 30-150 seconds, then cooling the Cz silicon wafer to 800-1000° C. at a cooling rate of 5-50° C./s followed by a natural cooling.

(2) Annealing the Cz silicon wafer obtained in the step (1) at a temperature in a range of 800-900° C. under an argon atmosphere for 8-16 hours.

The purity of nitrogen is higher than 99.99%.

In the present invention, the density of the BMDs and the width of the DZ can be controlled by the temperature, the dwell time and the cooling rate of the RTP. Higher temperature, longer dwell time, and faster cooling rate of the RTP normally result in a higher BMD density and a smaller DZ width. If these processing conditions are reversed, a lower BMD density and a larger DZ width will be created.

Comparing with the existing IG processes, the IG process in the present invention has the following advantages:

(1) The thermal budget is significantly reduced because it involves only two heat treatment steps which require lower temperatures and shorter times.

(2) The density of the BMDs and the width of the DZ can be easily controlled by the temperature, duration and cooling rate of the RTP.

DETAILED DESCRIPTION OF THE PREFERRED EMBODIMENTS

Detailed description of various embodiments of the present invention is provided below with reference to the accompanying figures. However, the present invention is not limited by these embodiments.

First Embodiment (1) A 300 mm-diameter, <100>-oriented Cz silicon wafer with an interstitial oxygen concentration of $8 \times 10^{17}$ cm$^{-3}$ was subjected to the RTP under a high purity nitrogen atmosphere (purity is higher than 99.99%). Herein, the Cz silicon wafer was heated to 1250° C. at a heating rate of 100° C./s. After holding at this temperature for 60 seconds, the Cz silicon wafer was cooled to 800° C. at a cooling rate of 5° C./s. The power was then turned off to allow the Cz silicon wafer to cool naturally.

(2) The Cz silicon wafer obtained in the step (1) was annealed at 900° C. under an argon atmosphere for 8 hours.

Figure 1:
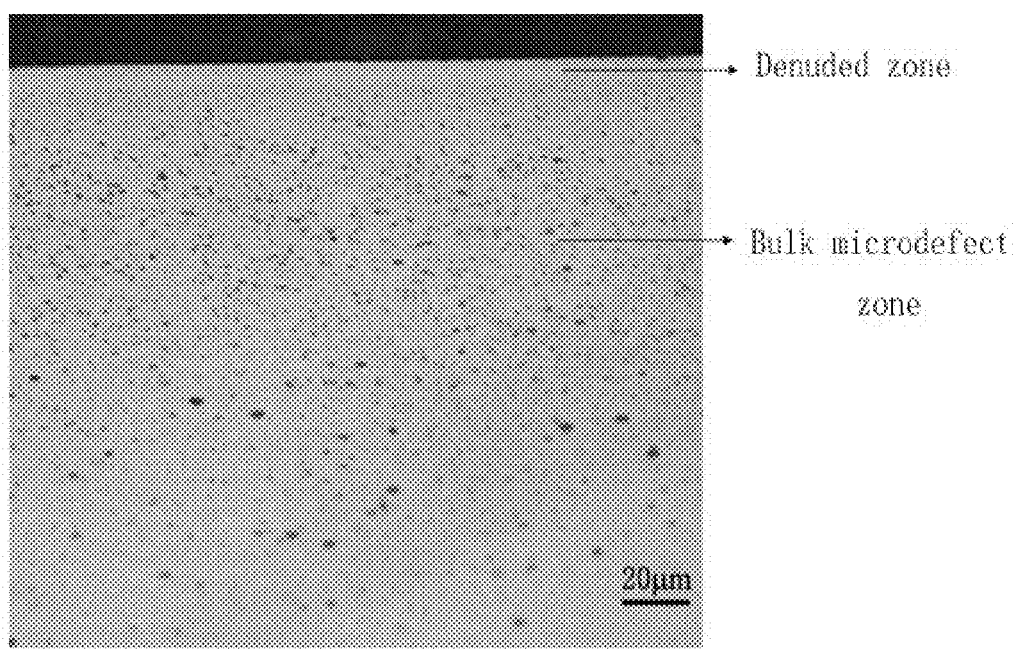
FIG. 1 is an optical microscopy (OM) image showing an etched cross section of a Cz silicon wafer comprising a denuded zone (DZ) and a bulk microdefect (BMD) zone in accordance with the first embodiment.

FIG. 1 is an OM image of an etched cross section of the silicon wafer after the heat treatment in accordance with the first embodiment. As revealed in FIG. 1, a DZ is formed in the near-surface region of the silicon wafer, and immediately under which is a region with BMDs for IG.

Second Embodiment (1) A 200 mm-diameter, <100>-oriented Cz silicon wafer with an interstitial oxygen concentration of $8 \times 10^{17}$ cm$^{-3}$ was subjected to the RTP under a high purity N$_2$ atmosphere (purity is higher than 99.99%). Herein, the Cz silicon wafer was heated to 1200° C. at a heating rate of 100° C./s. After holding at this temperature for 120 seconds, it was cooled to 1000° C. at a cooling rate of 50° C./s. The power was then turned off to allow the Cz silicon wafer to cool naturally.

(2) The Cz silicon wafer obtained in the step (1) was annealed at 900° C. under an argon atmosphere for 16 hours.

The resulting Cz silicon wafer is similar to that obtained in the first embodiment, namely, a DZ and a BMD zone were formed in the silicon wafer after the heat treatment as described above.

Third Embodiment (1) A 300 mm-diameter, <100>-oriented Cz silicon wafer with an interstitial oxygen concentration of $9 \times 10^{17}$ cm$^{-3}$ was subjected to the RTP under a high purity nitrogen atmosphere (purity is higher than 99.99%). Herein, the Cz silicon wafer was heated to 1200° C. at a heating rate of 100° C./s. After holding at this temperature for 150 seconds, it was cooled to 1000° C. at a cooling rate of 5° C./s. The power was then turned off to allow the Cz silicon wafer to cool naturally.

(2) The Cz silicon wafer obtained in the step (1) was annealed at 900° C. under an argon atmosphere for 16 hours.

Figure 2:
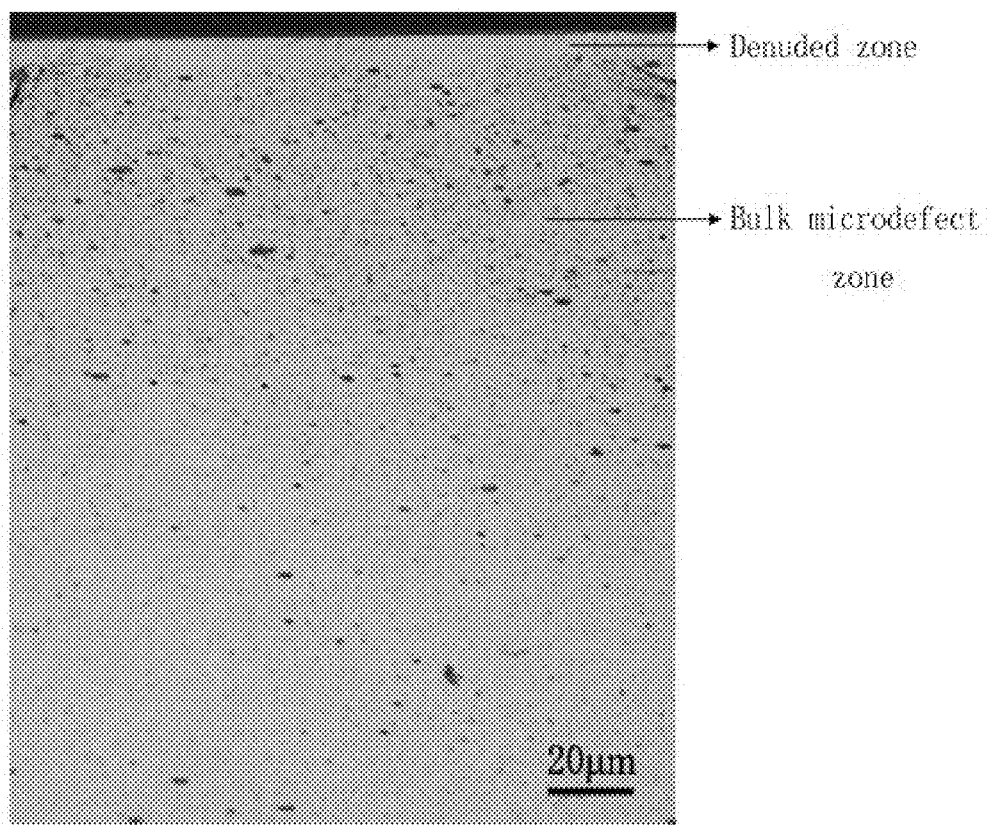
FIG. 2 is an OM image showing an etched cross section of a Cz silicon wafer comprising a DZ and a BMD zone in according with the third embodiment.

FIG. 2 is an OM image of an etched cross section of the Cz silicon wafer after the heat treatment in accordance with the third embodiment. As revealed in FIG. 2, a DZ is formed in the near-surface region, and immediately under which is a region with BMDs for IG.

Fourth Embodiment (1) A 200 mm-diameter, <100>-oriented Cz silicon wafer with an interstitial oxygen concentration of $7.5 \times 10^{17}$ cm$^{-3}$ was subjected to the RTP under a high purity nitrogen atmosphere (purity is higher than 99.99%). Herein, the Cz silicon wafer was heated to 1200° C. at a heating rate of 100° C./s. After holding at this temperature for 150 seconds, it was cooled to 800° C. at a cooling rate of 5° C./s. The power was then turned off to allow the Cz silicon wafer to cool naturally.

(2) The Cz silicon wafer obtained in the step (1) was annealed at 800° C. under an argon atmosphere for 16 hours.

Similar to that of the first embodiment, a DZ and a region containing BMDs were formed in the Cz silicon wafer.

Figure 3:
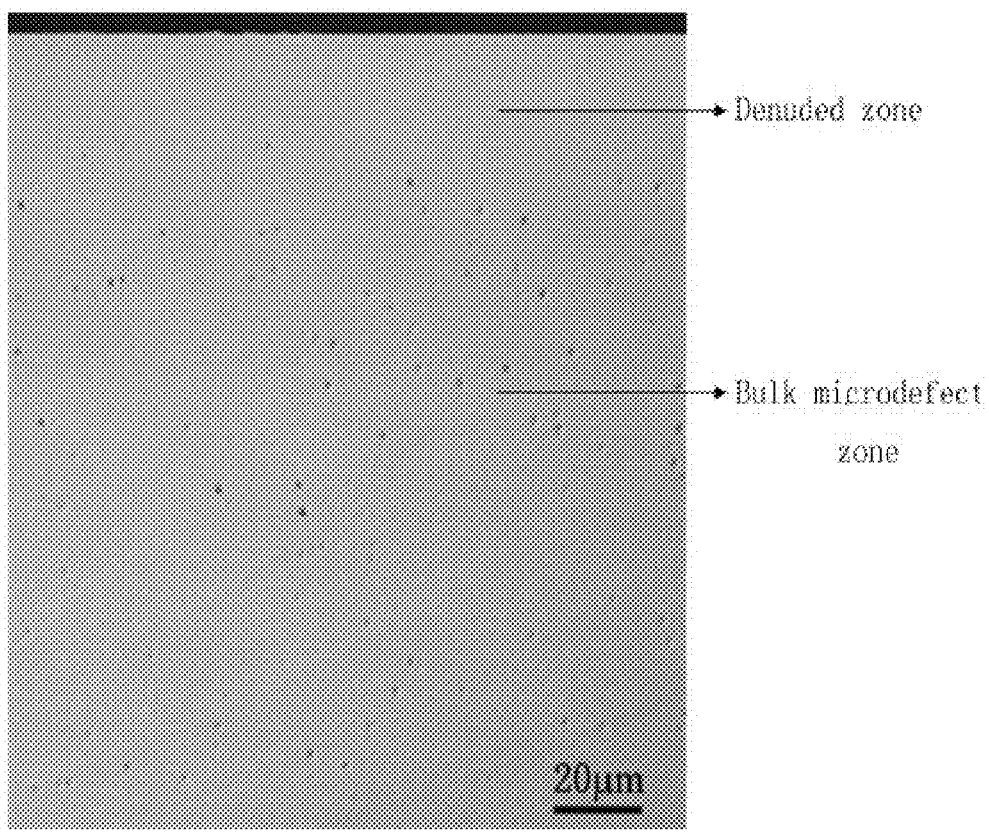
FIG. 3 is an OM image showing an etched cross section of a Cz silicon wafer comprising a DZ and a BMD zone in accordance with the fourth embodiment.

FIG. 3 is an OM image of an etched cross section of the silicon wafer after the heat treatment in accordance with the fourth embodiment. As revealed in FIG. 3, a DZ is formed in the near-surface region, and immediately under which is a region with BMDs for IG.

What is claimed is:

1. An internal gettering process for a Cz silicon wafer, comprising:
    a rapid thermal processing treatment, comprising:
        heating a Cz silicon wafer to a temperature in a range from 1200° C. to 1250° C. at a heating rate between 50° C./second and 100° C./second under a nitrogen atmosphere,
        maintaining the Cz silicon wafer at the temperature for a period of 30 seconds to 150 seconds,
        cooling the Cz silicon wafer to a temperature in a range from 800° C. to 1000° C. at a cooling rate between 5° C./second and 50° C./second, and
        cooling the Cz silicon wafer naturally; and
    annealing the Cz silicon wafer obtained in the rapid thermal processing treatment at a temperature in a range from 800° C. to 900° C. under an argon atmosphere for a period of 8 hours to 16 hours.

2. The internal gettering process for a Cz silicon wafer of claim 1, wherein a purity of the nitrogen atmosphere is higher than 99.99%.

3. The internal gettering process for a Cz silicon wafer of claim 1, wherein a diameter of the Cz silicon wafer is in a range between 200 mm and 300 mm.

* * * * *